U S009874335B2

United States Patent
Hong et al.

(10) Patent No.: US 9,874,335 B2
(45) Date of Patent: Jan. 23, 2018

(54) PRINTED CIRCUIT BOARD, AND LIGHTING DEVICE AND BACKLIGHT UNIT INCLUDING THE SAME

(71) Applicant: LG INNOTEK CO., LTD., Seoul (KR)

(72) Inventors: Seung Kwon Hong, Seoul (KR); Hyun Gyu Park, Seoul (KR); In Hee Cho, Seoul (KR); Hyuk Soo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 670 days.

(21) Appl. No.: 14/091,755

(22) Filed: Nov. 27, 2013

(65) Prior Publication Data

US 2014/0153221 A1    Jun. 5, 2014

(30) Foreign Application Priority Data

Nov. 30, 2012    (KR) .................. 10-2012-0138165

(51) Int. Cl.
*F21V 19/00*    (2006.01)
*H05K 1/02*    (2006.01)
(Continued)

(52) U.S. Cl.
CPC .......... *F21V 19/003* (2013.01); *H05K 1/028* (2013.01); *G02F 2001/133612* (2013.01); *H05K 1/0278* (2013.01); *H05K 3/0061* (2013.01); *H05K 2201/0394* (2013.01); *H05K 2201/09063* (2013.01); *H05K 2201/10106* (2013.01); *H05K 2203/302* (2013.01)

(58) Field of Classification Search
CPC .... F21V 19/003; H05K 1/028; H05K 1/0278; H05K 3/0061; H05K 2201/0394; H05K 2201/09063; H05K 2201/10106; H05K 2203/302; G02F 2001/133612
USPC ...................................... 362/249.02
See application file for complete search history.

(56) References Cited

U.S. PATENT DOCUMENTS

| 2007/0047149 | A1 | 3/2007 | Motonishi |
| 2009/0186661 | A1* | 7/2009 | Kim ............ H05K 1/0271 455/566 |
| 2010/0270923 | A1 | 10/2010 | Froehlich et al. |

FOREIGN PATENT DOCUMENTS

| CN | 1158689 A | 9/1997 |
| EP | 0-312-415 A1 | 4/1989 |

(Continued)

OTHER PUBLICATIONS

Partial European Search Report dated May 23, 2014 in European Application No. 13195004.

(Continued)

*Primary Examiner* — Bao Q Truong
(74) *Attorney, Agent, or Firm* — Saliwanchik, Lloyd & Eisenschenk

(57) ABSTRACT

Provided is a printed circuit board including: a support substrate including a first area in which a light emitting device is mounted, and a second area extending from the first area; a bending part which is configured such that a part between the first area and the second area is bent; a through hole passing through the bending part; a connection wiring connected to the light emitting device and disposed on the bending part; and a wiring connected to the connection wiring.

14 Claims, 3 Drawing Sheets

(51) Int. Cl.
*H05K 3/00* (2006.01)
*G02F 1/1335* (2006.01)

(56) References Cited

FOREIGN PATENT DOCUMENTS

| EP | 0-779-772 A1 | 6/1997 |
|---|---|---|
| JP | H03-053861 | 5/1991 |
| JP | H07-240599 | 9/1995 |
| JP | H09-326575 | 12/1997 |
| JP | 2010-238540 A | 10/2010 |

OTHER PUBLICATIONS

Office Action dated Apr. 18, 2016 in Chinese Application No. 201310611193.

\* cited by examiner

PRINTED CIRCUIT BOARD, AND LIGHTING DEVICE AND BACKLIGHT UNIT INCLUDING THE SAME

CROSS-REFERENCE TO RELATED APPLICATION

This application claims the benefit under 35 U.S.C. § 119 of Korean Patent Application No. 10-2012-0138165, filed Nov. 30, 2012, which is hereby incorporated by reference in its entirety.

BACKGROUND

Field of the Invention

Embodiments of the present invention relates to a printed circuit board, and a lighting device and backlight unit including the printed circuit board.

Description of the Related Arts

According to the development of electronic device industries, various display devices have been developed, and an image device, a computer, a mobile communication terminal and the like using the display devices have been also developed. A liquid crystal display device which appeared according to this trend is catching on as a display device such as a monitor, a mobile communication terminal and the like.

A liquid crystal display (LCD) is based on applying electrical and optical properties of liquid crystal having an intermediate property between liquid and solid to a display device, and serves to convert various kinds of electrical information generated from various devices into a visual information from using a variation in transmittance of the liquid crystal according to an applied voltage to transmits the information. The LCD is a widely used flat display because it has low power consumption due to its low operating voltage and is a conveniently portable device.

Since the LCD has no self-luminous property for emitting light itself, a backlight is always needed for all the LCDs. The backlight serves as a light source of the LCD, and a backlight unit is a complex that forms a power circuit for drive of the light source as well as the light source for irradiating light to a rear surface of a liquid crystal module and all appendages which enable uniform flat light to form. As a light source for illuminating the LCD, the backlight unit using a light emitting diode (LED) has been recently suggested. The LED is a lighting emitting device which generates light using a light emitting phenomenon generated when a voltage is applied to a semiconductor. This LED has a small size and long lifespan compared to the conventional light source. Furthermore, since the LED directly converts electrical energy into light energy, it has high energy efficiency and a low operating voltage.

As the liquid crystal display device configured as above becomes gradually slimmer, it has been needed to reduce a width of the liquid crystal display device. Accordingly, in order to reduce the width of the liquid crystal display device, a size of the backlight unit which has an effect on the width of the liquid crystal display device should be reduced. The size of the backlight unit can be reduced by reducing a pad part or a string part of a printed circuit board.

FIG. 1 is a view illustrating a printed circuit board according to a conventional art.

Referring to FIG. 1, the printed circuit board (PCB) includes a pad part 50 in which a plurality of light emitting devices 40 like LEDs are mounted, and a string part 60 in which a string wiring connected to the light emitting devices 40 and for transmitting an electric signal to the light emitting devices 40 is formed.

When bending treatment is performed for the printed circuit board, an insulating substrate or the string wiring within a bending part 70 formed between the pad part 50 and the string part 60 is damaged such as being ripped or pressed. Due to this damage, a defect in electricity or appearance occurs, thereby causing damage to the printed circuit board.

Accordingly, by forming the bending part not to have damage thereto and efficiently forming a wiring of the printed circuit board, a way for reducing a height of the liquid crystal display device has been needed.

BRIEF SUMMARY

An aspect of embodiments of the present invention provides a printed circuit board which can inhibit a connection wiring from being damaged by disposing the connection wiring connected to a wiring in a through hole of a bending part formed between a first area and a second area of a printed circuit board.

An aspect of embodiments of the present invention also provides a printed circuit board that can inhibit a wiring from being damaged upon bending by forming the wiring on a rear surface of an area of the printed circuit board in which a light emitting device is mounted, and can minimize a width of the printed circuit board.

According to an aspect of embodiments of the present invention, there is provided a printed circuit board, including: a support substrate including a first area in which a light emitting device is mounted, and a second area extending from the first area; a bending part which is configured such that a part between the first area and the second area is bent; a through hole passing through the bending part; a connection wiring connected to the light emitting device and disposed on the bending part; and a wiring connected to the connection wiring.

According to an embodiment of the present invention, the printed circuit board may further include a pad part for connecting the light emitting device and the connection wiring.

According to the embodiment of the present invention, the wiring may be disposed on the second area.

According to the embodiment of the present invention, the printed circuit board may further include an insulating substrate formed on the support substrate.

According to the embodiment of the present invention, the wiring may be formed on the insulating substrate.

According to another aspect of the present invention, there is provided a printed circuit board, including: a support substrate including a first area in which a light emitting device is mount, and a second area extending from the first area; a bending part which is configured such that a part between the first area and the second area is bent; a connection wiring connected to the light emitting device, and disposed at one side end corresponding to another side end of the first area in which the bending part is formed; and a wiring connected to the connection wiring.

According to another embodiment of the present invention, the printed circuit board may further include a first insulating substrate disposed at the support substrate located on one surface of the first area; and a second insulating substrate disposed at the support substrate located on another surface of the first area.

According to the other embodiment of the present invention, the light emitting device may be mounted on the first insulating substrate.

According to the other embodiment of the present invention, the printed circuit board may further include a pad part disposed on the first insulating substrate and for connecting the light emitting device and the connection wiring.

According to the other embodiment of the present invention, the wiring may be disposed on the second insulating substrate.

According to still another aspect of the present invention, there is provided a lighting device including each of the printed circuit boards which are configured as described above.

According to still further another aspect of the present invention, there is provided a backlight unit including each of the printed circuit boards which are configured as described above.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
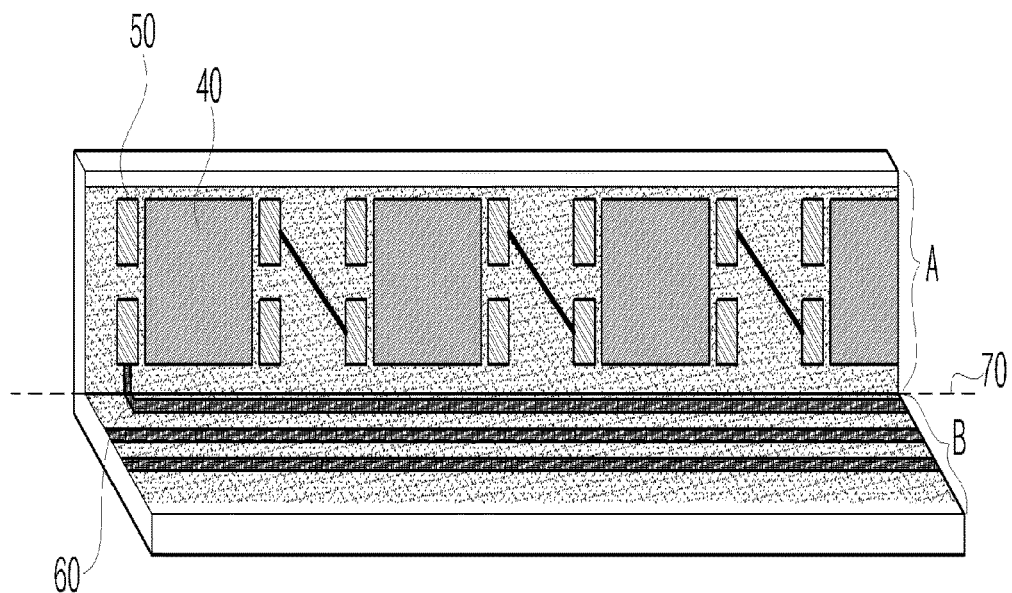
FIG. 1 is a view illustrating a printed circuit board according to a conventional art.

Hereinafter, embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Also, regardless reference numerals of drawing, like numbers may refer to like elements throughout the description of the figures. The repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

Figure 2:
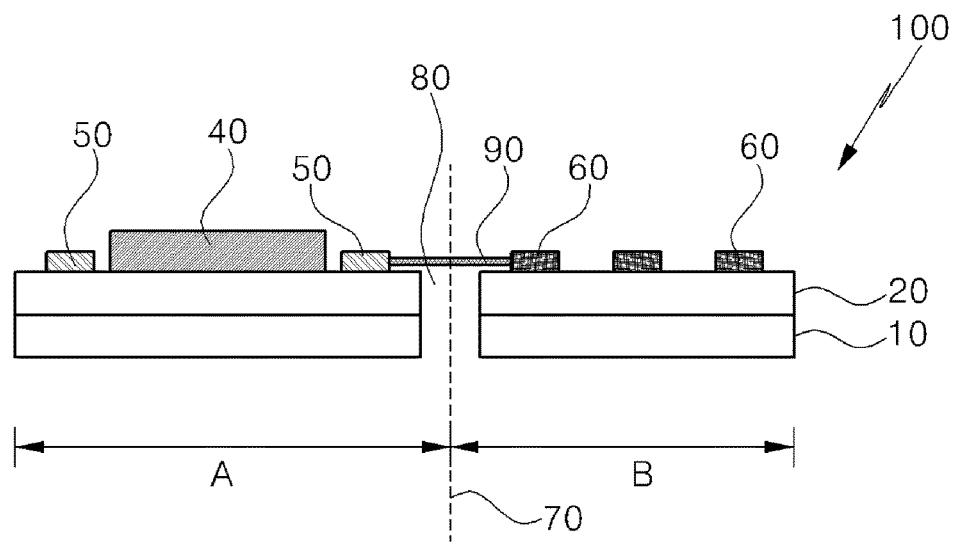
FIG. 2 is a cross-sectional view illustrating a printed circuit board according to one exemplary embodiment of the present invention.
Figure 3:
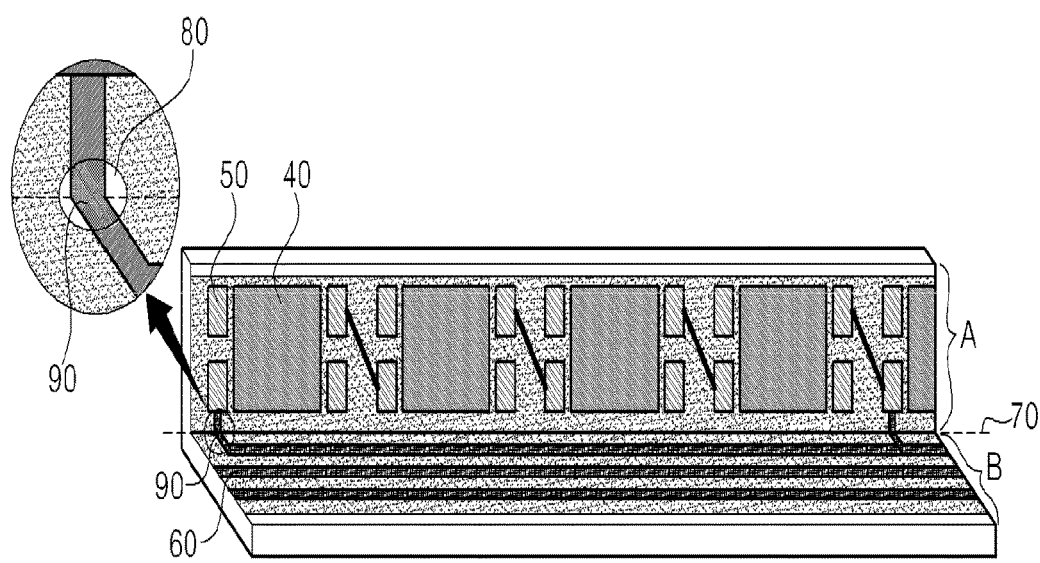
FIG. 3 is a front view illustrating the printed circuit board of FIG. 2.

FIG. 2 is a cross-sectional view illustrating a printed circuit board according to one exemplary embodiment of the present invention, and FIG. 3 is a front view illustrating the printed circuit board of FIG. 2.

Referring to FIG. 2 and FIG. 3, the printed circuit board 100 includes: a support substrate 10, a bending part 70, a through hole 80, a connection wiring 90, and a wiring 60, and further includes an insulating substrate 20 and a pad part 50.

The support substrate 10 includes a first area A in which a light emitting device 40 is mounted, and a second area B extending from the first area A.

The insulating substrate 20 is formed on the support substrate 10.

The bending part 70 is configured in a structure in which a part between the first area A and the second area B of the support substrate 10 is bent, and the through hole 80 is configured to pass through the bending part 70.

The connection wiring 90 is connected to the light emitting device 40 and is disposed on the bending part 70, and the wiring 60 is connected to the connection wiring 90.

The wiring 60 is disposed on the second area B so as to transmit an electrical signal to the light emitting device 40 through the connection wiring 90.

At this time, the insulating substrate 20 is formed on the support substrate 10, the light emitting device 40 and the pad part 50 are mounted on the first area A of the insulating substrate 30, and the wiring 60 is disposed on the second area B of the insulating substrate 30.

The conventional printed circuit board is problematic in that the wiring formed in the bending part 70 is damaged when bending treatment is conducted in order to form the bending part 70 between the first area A and the second area B (see FIG. 1). Accordingly, in the present embodiment of the invention, the through hole 80 is formed in the bending part 70 between the first area A and the second area B, and the connection wiring 90 for connecting the pad part 50 and the wiring is formed in the through hole 80, thereby inhibiting the connection wiring 90 formed in the bending part 70 from being damaged.

The bending part 70 may be configured such that a part between the pad part 50 and the wiring part 60 is bent at a certain angle.

Since the through hole 80 is formed in an area in which the connection wiring 90 is formed, the through hole 80 may be disposed to correspond to a position of the connection wiring 90.

Also, the through hole 80 may be used in bending the printed circuit board 100. Accordingly, the through hole 80 can inhibit the insulating substrate 20 or the connection wiring 90 from being ripped or pressed due to formation of the bending part 70.

As an example, the support substrate 10 may be made of at least one of Al, Au, Ag, Cr, an organic compound, an inorganic compound, and a magnetic material.

Meanwhile, the insulating substrate 20 is made of at least one of polyethylene terephthalate (PET), polycarbonate (PC), polyether sulfone (PES), polyimide (PI) and PolyMethly MethaAcrylate (PMMS). The light emitting device 40 may be a light emitting diode (LED) or side-emitting type LED.

The printed circuit board 100 illustrated in FIG. 2 and FIG. 3 may be provided in a lighting device or a backlight unit according to the embodiments.

Figure 4:
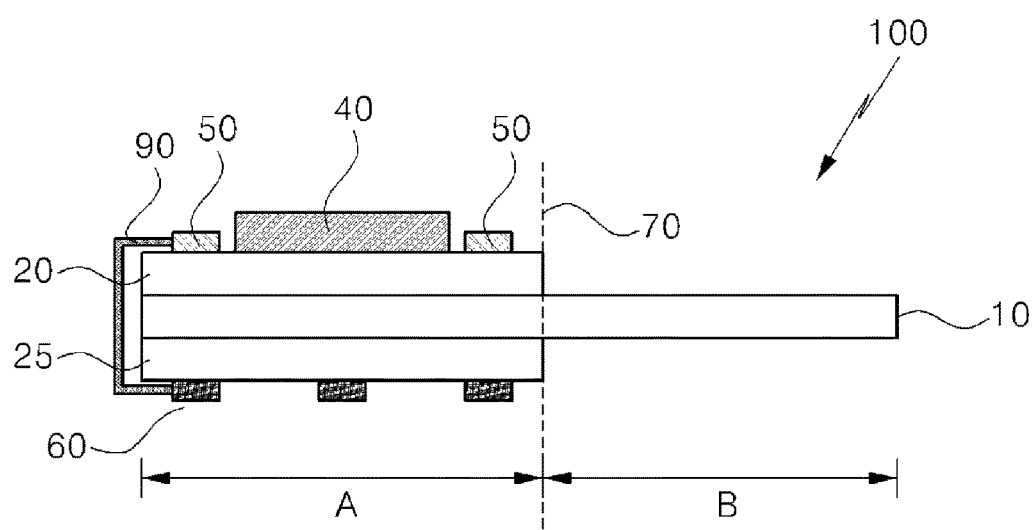
FIG. 4 is a cross-sectional view illustrating a printed circuit board according to another embodiment of the present invention.

FIG. 4 is a cross-sectional view illustrating a printed circuit board according to another embodiment of the present invention.

Referring to FIG. 4, according to the present embodiment of the invention, the printed circuit board 100 includes: the support substrate 10, the bending part 70, the connection wiring 90 and the wiring 60, and further includes the insulating substrates 20, 25 and the pad part 50.

The support substrate 10 includes a first area A in which a light emitting device is mounted, and a second area (B) extending from the first area A.

The bending part 70 is configured in a structure in which a part between the first area A and the second area B is bent.

The first insulating substrate 20 may be disposed on one surface of the first area A of the support substrate 10, and the second insulating substrate 25 may be disposed on another surface of the first area A.

Meanwhile, the connection wiring 90 is connected to the light emitting device 40. At this time, the connection wiring 90 is disposed at one side end corresponding to another side end of the first area A in which the bending part 70 is formed.

That is, as illustrated in FIG. 4, in the first area of the support substrate 10, the connection wiring 90 may connect the light emitting device 40 and the wiring 60 by crossing the one side end corresponding to the bending part 70.

At this time, the connection wiring 90 may be connected to the light emitting device 40 by the pad part 50.

According to the embodiment of FIG. 4, when the printed circuit board 100 in which the light emitting device 40 is mounted is included in a liquid crystal display (LCD) device, the second area B is disposed in a bezel of the liquid crystal display, and thus a size of the bezel can be reduced as much as a reduced width of the second area B.

Figure 5:
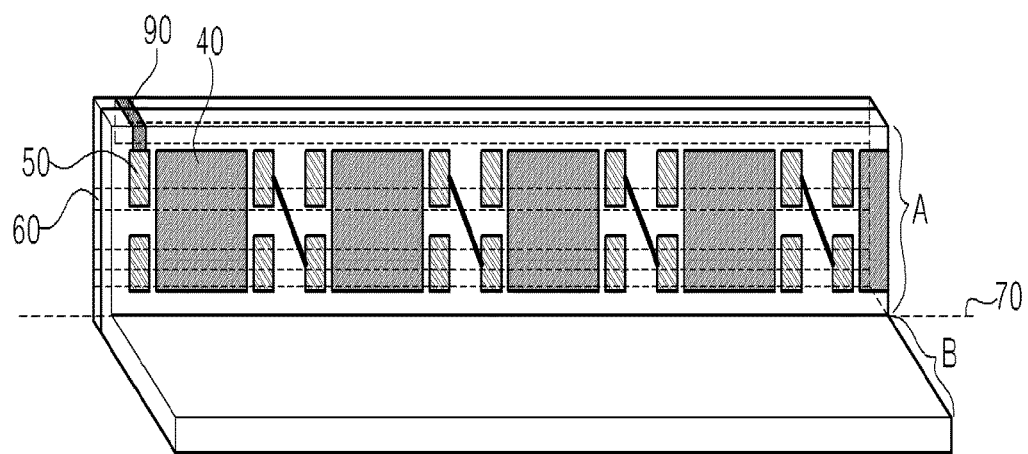
FIG. 5 illustrates a front view of the printed circuit board of FIG. 4.
Figure 6:
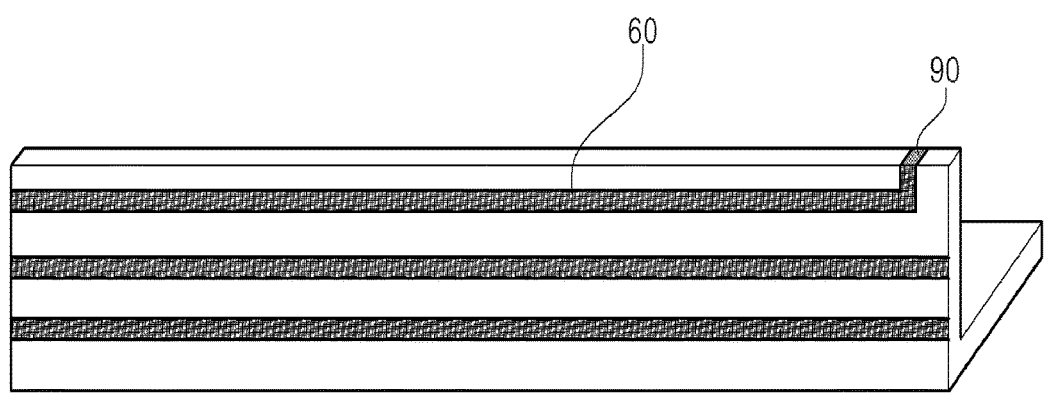
FIG. 6 illustrates a rear view of the printed circuit board of FIG. 4.

FIG. 5 illustrates a front view of the printed circuit board of FIG. 4, and FIG. 6 illustrates a rear view of the printed circuit board of FIG. 4.

As illustrated in FIG. 5, the light emitting device 40, and the pad part 50 connected to the light emitting device may be disposed on a front surface corresponding to one surface of the first area A, and as illustrated in FIG. 6, the wiring may be formed on a rear surface corresponding to another surface of the first area A.

According to the present embodiment of the invention, since the connection wiring 90 is formed at the one side end corresponding to the bending part 70 of the printed circuit board, the wiring is not damaged thanks to the bending part 70 upon bending the printed circuit board 100.

Meanwhile, according to still another embodiment of the present invention, the pad part 50 and the wiring 60 may be integrally formed in the insulating substrate 20.

The printed circuit board 100 of FIG. 4 to FIG. 6 may be provided in a lighting device or a backlight unit according to each embodiment.

According to each embodiment, when the light emitting device 40 and the wiring are formed on one surface (front surface) and another surface (rear surface) of the first area A of the insulating substrate 20, respectively, the printed circuit board may be configured in a straight structure rather than a bending structure.

As set forth above, according to the embodiment of the present invention, the connection wiring connected to the wiring is disposed within the through hole of the bending part formed between the first area and the second area, thereby inhibiting the connection wiring from being damaged.

Furthermore, according to the embodiment of the present invention, the wiring is formed on the rear surface of the area of the printed circuit board in which the lighting emitting device is mounted, thereby inhibiting the wiring from being damaged upon bending, and minimizing a width of the printed circuit board.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A printed circuit board, comprising:
a support substrate including a first area to which a light emitting device is mounted, and a second area extending from the first area;
a bending part formed by bending a part of the support substrate between the first area and the second area;
a through hole disposed at the bending part;
a connection wiring connected to the light emitting device and disposed on the bending part; and
a wiring connected to the connection wiring disposed in the second area;
wherein the connection wiring is passed through the through hole disposed at the bending part, electrically connecting the light emitting device in the first area and the wiring in the second area.

2. The printed circuit board of claim 1, further comprising a pad part connecting the light emitting device and the connection wiring.

3. The printed circuit board of claim 1, further comprising an insulating substrate formed on the support substrate.

4. The printed circuit board of claim 3, wherein the wiring is formed on the insulating substrate.

5. A lighting device comprising the printed circuit board of claim 1.

6. A backlight unit comprising the printed circuit board of claim 1.

7. A printed circuit board, comprising:
a support substrate including a first area, and a second area extending from the first area wherein the second area is disposed in a bezel of a liquid crystal display;
a bending part formed by bending a part of the support substrate between the first area and the second area;
a first insulating substrate disposed on one surface of the first area of the support substrate, a light emitting device and a pad part both being mounted on the one surface;
a second insulating substrate disposed on another surface of the first area of the support substrate, a wiring being mounted on the another surface;
a connection wiring connecting between the pad part and the wiring,
wherein the connection wiring
crosses over one side end of the first area that corresponds to another side end of the first area in which the bending part is formed.

8. The printed circuit board of claim 7, further comprising a through hole passing through the bending part.

9. A lighting device comprising the printed circuit board of claim 7.

10. A backlight unit comprising the printed circuit board of claim 7.

11. A lighting device comprising the printed circuit board of claim 2.

12. A lighting device comprising the printed circuit board of claim 1.

13. A lighting device comprising the printed circuit board of claim 3.

14. A lighting device comprising the printed circuit board of claim 4.

* * * * *